United States Patent [19]

Gordon

[11] 4,206,252
[45] Jun. 3, 1980

[54] DEPOSITION METHOD FOR COATING GLASS AND THE LIKE

[76] Inventor: Roy G. Gordon, 22 Highland St., Cambridge, Mass. 02138

[21] Appl. No.: 884,432

[22] Filed: Mar. 8, 1978

Related U.S. Application Data

[63] Continuation-in-part of Ser. No. 784,542, Apr. 4, 1977.

[51] Int. Cl.² .......................... B05D 5/06; B05D 1/34; B05D 1/36
[52] U.S. Cl. ...................................... 427/160; 427/162; 427/164; 427/166; 427/255.2; 427/255.3; 427/255
[58] Field of Search ................ 427/160, 166, 162, 164, 427/248 B, 248 C, 255

[56] References Cited

U.S. PATENT DOCUMENTS

| | | | |
|---|---|---|---|
| 3,410,710 | 11/1968 | Mochel | 427/160 |
| 3,460,960 | 8/1969 | Francel et al. | 427/160 X |
| 3,846,152 | 11/1974 | Franz | 427/160 X |
| 3,900,609 | 8/1975 | Wille | 427/166 |

Primary Examiner—James R. Hoffman
Attorney, Agent, or Firm—Robert A. Cesari; John F. McKenna; Andrew F. Kehoe

[57] ABSTRACT

This disclosure describes transparent glass window structures of the type bearing a first coating of infra-red reflective material which is advantageously less than about 0.85 microns in thickness and wherein the observance of iridescence resulting from such a first coating is markedly reduced by provision of a layer of continuously varying refractive index between the glass and the coating, such that the refractive index increases continuously from the glass to the first coating, thereby preventing the observation of iridescence. The invention also encompasses simple processes for providing such windows. A particular advantage of the invention is its efficacy with clear and lightly tinted glasses wherein the problem of iridescent color has had its greatest commercial impact.

20 Claims, 6 Drawing Figures

DEPOSITION METHOD FOR COATING GLASS AND THE LIKE

RELATED APPLICATIONS

This application is a continuation-in-part of U.S. Ser. No. 784,542 filed Apr. 4, 1977.

BACKGROUND OF THE INVENTION

This invention relates to glass structures bearing a thin, functional, inorganic coating (e.g. a coating of tin oxide forming means to promote reflectivity of infra-red light) which structures have improved appearance as a consequence of reduced iridescence historically associated with said thin coatings, and methods for achieving the aforesaid structures.

Glass and other transparent materials can be coated with transparent semiconductor films such as tin oxide, indium oxide or cadium stannate, in order to reflect infra-red radiation. Such materials are useful in providing windows with enhanced insulating value (lower heat transport), e.g. for use in ovens, architectural windows, etc. Coatings of these same materials also conduct electricity, and are employed as resistance heaters to heat windows in vehicles in order to remove fog or ice.

One objectionable feature of these coated windows is that they show interference colors (iridescence) in reflected light, and, to a lesser extent, in transmitted light. This iridescence has been a serious barrier to widespread use of these coated windows (see, for example, American Institute of Physics Conference Proceeding No. 25, New York, 1975, Page 288.)

In some circumstances, i.e. when the glass is quite dark in tone (say, having a light transmittance of less than about 25%) this iridescence is muted and can be tolerated. However, in most architectural wall and window applications, the iridescent effect normally associated with coatings of less than about 0.75 microns is aesthetically unacceptable to many people (See, for example, U.S. Pat. No. 3,710,074 to Stewart.)

Iridescent colors are quite a general phenomenon in transparent films in the thickness range of about 0.1 to 1 micron, especially at thicknesses below about 0.85 micron. Unfortunately, it is precisely this range of thickness which is of practical importance in most commercial applications. Semiconductor coatings thinner than about 0.1 micron do not show interference colors, but such thin coatings have a markedly inferior reflectance of infra-red light, and a markedly reduced capacity to conduct electricity.

Coatings thicker than about 1 micron also do not show visible iridescence in daylight illumination, but such thick coatings are much more expensive to make, since larger amounts of coating materials are required, and the time necessary to deposit the coating is correspondingly longer. Furthermore, films thicker than 1 micron have a tendency to show haze, which arises from light scattering from surface irregularities, which are larger on such films. Also, such films show a greater tendency to crack, under thermal stress, because of differential thermal expansion.

As a result of these technical and economic constraints, almost all present commercial production of such coated glass articles comprise films in the thickness range of about 0.1 to 0.3 microns, which display pronounced iridescent colors. Almost no architectural use of this coated glass is made at present, despite the fact that it would be cost-effective in conserving energy to do so. For example, heat loss by infra-red radiation through the glass areas of a heated building can approximate about one-half of the heat loss through uncoated windows. The presence of iridescent colors on these coated glass products is a major reason for the failure to employ these coatings.

Co-pending application, Ser. No. 784,542, discloses means to reduce this iridescence to unobservably small values, by means of an additional layer or layers placed in register with the main coating, including a gradient-type coating. The present disclosure is directed primarily toward improved means for forming such a gradient-type anti-iridescent layer.

SUMMARY OF THE INVENTION

It is one object of the present invention to provide means to eliminate the visible iridescence from semiconducting thin film coatings on glass, while maintaining their desirable properties of visible transparency, infra-red reflectivity, and electrical conductivity.

Another object of the present invention is to achieve the above goals without increasing the cost of production significantly over the cost of using ordinary iridescent films.

Another object of the present invention is to achieve the above aims with a process which is continuous and fully compatible with modern manufacturing processes in the glass industry.

A further object of the present invention is to achieve all of the above goals with products which are highly durable and stable to light, chemicals and mechanical abrasion.

Another object is to achieve all of the above goals using materials which are sufficiently abundant and readily available to permit widespread use.

A further object of the invention is to provide means to reduce the total amount of light reflected from the coated surface of glass and thereby increase the total transmission of light by the glass.

Another object of the invention is to provide a glass structure comprising a compound coating wherein an outer coating is formed of an infra-red reflecting surface of about 0.7 micron or less and wherein an inner coating forms means for (a) reducing haze on the coated glass and, simultaneously and independently (b) reducing the iridescence of the glass structure.

A further object of the invention is to provide a glass structure having the non-iridescent characteristics referred to above which structure is characterized by a gradual change in coating composition between glass and said outer coating.

Other objects of the invention are to provide novel apparatus and processes which are suitable for making the above identified novel products and, indeed, which are suitable for use in making coatings of gradually changing compositions and from gaseous reactants whether or not such coating be on glass or some other substrate and whether or not such coatings comprise a maximum amount of one component within or at an extremity of the depth of the coating structure.

Other objects of the invention will be obvious to those skilled in the art on reading the instant invention.

The invention utilizes the formation of layers of transparent material between the glass and the semiconductor film. These layers have refractive indices intermediate between those of the glass and the semi-conductor film. With suitable choices of thickness and refractive index values of these intermediate layers, it has been discovered that the iridescent colors can be made too faint for most human observers to detect, and certainly too faint to interfere with widespread commercial use even in architectural applications. Suitable materials for these intermediate layers are also disclosed herein, as well as processes for the formation of these layers.

In the preferred form of the invention, these intermediate layers blend together continuously to form a graded layer in which the refractive index varies, preferably in a smooth transition, as one moves through the layer away from the glass toward the semiconductor coating, from a value at the glass surface matching the index of the glass, to a refractive index value matching that of the overlying semiconductor film, at a point proximate to that overlying film.

A coating with refractive index varying through its thickness may be produced by a novel method disclosed herein, in which a gas mixture with components of different reactivities, flows along the surface of a moving glass substrate.

METHODS AND ASSUMPTIONS

It is believed desirable, because of the subjective nature of color perception, to provide a discussion of the methods and assumptions which have been used to evaluate the invention disclosed herein. It should be realized that the application of much of the theory discussed below is retrospective in nature because the information necessarily is being provided in hindsight, i.e. by one having a knowledge of the invention disclosed herein.

In order to make a suitable quantitative evaluation of various possible constructions which suppress iridescent colors, the intensities of such colors were calculated using optical data and color perception data. In this discussion, film layers are assumed to be planar, with uniform thickness and uniform refractive index within each layer. In this evaluation any refractive index changes are taken to be abrupt at the planar interfaces between adjacent film layers. A continuously varying refractive index may be modelled as a sequence of a very large number of very thin layers with closely spaced refractive indices. Real refractive indices are used, corresponding to negligible absorption losses within the layers. The reflection coefficients are evaluated for normally incident plane waves of unpolarized light.

Using the above assumptions, the amplitudes for reflection and transmission from each interface are calculated from Fresnel's formulae. Then these amplitudes are summed, taking into account the phase differences produced by propagation through the relevant layers. These results have been found to be equivalent to the Airy formulae (See, for example, *Optics of Thin Films*, by F. Knittl, Wiley and Sons, New York, 1976) for multiple reflection and interference in thin films, when those formulae were applied to the same cases.

The calculated intensity of reflected light has been observed to vary with wavelength, and thus is enhanced in certain colors more than in others. To calculate the reflected color seen by an observer, it is desirable first to specify the spectral distribution of the incident light. For the purpose, one may use the International Commission on Illumination Standard Illuminant C, which approximates normal daylight illumination. The spectral distribution of the reflected light is the product of the calculated reflection coefficient and the spectrum of Illuminant C. The color hue and color saturation as seen in reflection by a human observer, are then calculated from this reflected spectrum, using the uniform color scales such as those known to the art. One useful scale is that disclosed by Hunter in *Food Technology*, Vol. 21, pages 100-105, 1967. This scale has been used in deriving the relationship now to be disclosed.

The results of calculations, for each combination of refractive indices and thicknesses of the layers, are a pair of numbers, i.e. "a" and "b". "a" represents red (if positive) or green (if negative) color hue, while "b" describes a yellow (if positive) or blue (if negative) hue. These color hue results are useful in checking the calculations against the observable colors of samples including those of the invention. A single number, "c", represents the "color saturation": $c = (a^2 + b^2)^{\frac{1}{2}}$. This color saturation index, "c", is directly related to the ability of the eye to detect the troublesome iridescent color hues. When the saturation index is below a certain value, one is not able to see any color in the reflected light. The numerical value of this threshold saturation of observability depends on the particular uniform color scale used, and on the viewing conditions and level of illumination (see, for example, R. S. Hunter, *The Measurement of Appearance*, Wiley and Sons, New York, 1975, for a review of numerical color scales.)

In order to establish a basis for comparison of structures a first series of calculations was carried out to simulate a single semiconductor layer on glass. The refractive index of the semiconductor layer was taken at 2.0, which is a value approximating tin oxide, indium oxide, or cadmium stannate films. The value 1.52 was used for the glass substrate; this is a value typical of commercial window glass. The calculated color saturation values are plotted in FIG. 1 as a function of the semiconductor film thickness. The color saturation is found to be high for reflections from films in the thickness range 0.1 to 0.5 microns. For films thicker than 0.5 micron, the color saturation decreases with increasing thickness. These results are in accord with qualitative observations of actual films. The pronounced oscillations are due to the varying sensitivity of the eye to different spectral wavelengths. Each of the peaks corresponds to a particular color, as marked on the curve (R=red, Y=yellow, G=green, B=blue).

Using these results, the minimum observable value of color saturation was established by the following experiment: Tin oxide films with continuously varying thickness, up to about 1.5 microns, were deposited on glass plates, by the oxidation of tetramethyltin vapor. The thickness profile was established by a temperature variation from about 450° C. to 500° C. across the glass surface. The thickness profile was then measured by observing the interference fringes under monochromatic light. When observed under diffused daylight, the films showed interference colors at the correct positions shown in FIG. 1 The portions of the films with thicknesses greater than 0.85 micron showed no observable interference colors in diffused daylight. The green peak calculated to lie at a thickness of 0.88 micron could not been seen. Therefore, the threshold of observability is above 8 of these color units. Likewise, the calculated blue peak at 0.03 micron could not been seen, so the threshold is above 11 color units, the calculated value for this peak. However, a faint red peak at 0.81 micron could be seen under good viewing conditions, e.g. using a black velvet background and no colored objects in the field of view being reflected, so the threshold is below the 13 color units calculated for this color. We conclude from these studies that the threshold for observation of reflected color is between 11 and 13 color units on this scale, and therefore we have adopted a value of 12 units to represent the threshold for observability of reflected color under daylight viewing conditions. In other words, a color saturation of more than 12 units appears as a visibly colored iridescence, while a color saturation of less than 12 units is seen as neutral.

It is believed that there will be little objection to commercialization of products having color saturation values of 13 or below. However, it is much preferred that the value be 12 or below and, as will appear in more detail hereinafter, there appears to be no practical reason why the most advantageous products according to the invention, e.g. those characterized by wholly color-free surfaces, i.e. below about 8, cannot be made economically.

A value of 12 or less is indicative of a reflection which does not distort the color of a reflected image in an observable way. This threshold value of 12 units is taken to be a quantitative standard with which one can evaluate the success or failure of various multilayer designs, in suppressing the iridescence colors.

Coatings with a thickness of 0.85 micron or greater have color saturation values less than this threshold of 12, as may be seen in FIG. 1. Experiments confirm that these thicker coatings do not show objectionable iridescence colors in daylight illumination.

USE OF AN INTERLAYER OF GRADUATED REFRACTIVE INDEX

It has been discovered that a film intermediate between the glass substrate and a semiconductor layer can be built up of a graded composition, e.g. gradually changing from a silica film to a tin oxide film. Such a film may be pictured as one comprising a very large number of intermediate layers. Calculations have been made of reflected color saturation for a variety of refractive index profiles between glass of refractive index n=1.52 and semiconductor coatings of refractive index n=2.0. For transition layers thicker than about 0.15 micron, the calculated color saturation index is usually below 12, i.e. neutral to the eye, and, for, transition layers more than about 0.3 microns the color is always undetectable. The exact shape of the refractive index profile has very little effect on these results, provided only that the change is gradual through the graded layer.

WHAT MATERIALS CAN BE USED

A wide range of transparent materials are among those which can be selected to make products meeting the aforesaid criteria by forming anti-iridescent undercoat layers. Various metal oxides and nitrides, and their mixtures have the correct optical properties of transparency and refractive index. Table A lists some mixtures which have the correct refractive index range between glass and a tin oxide or indium oxide film. The weight percents necessary can be taken from measured refractive index versus composition curves, or calculated from the usual Lorentz-Lorenz law for refractive indices of mixtures (Z. Knittl, *Optics of Thin Films*, Wiley and Sons, New York, 976, page 473), using measured refractive indices for the pure films. This mixing law generally gives sufficiently accurate interpolations for optical work, although the calculated refractive indices are sometimes slightly lower than the measured values. Film refractive indices also vary somewhat with deposition method and conditions employed.

FIG. 3 gives a typical curve of refractive index versus composition for the important case of silicon dioxide-tin dioxide mixtures.

Table A. Some combinations of compounds yielding transparent mixtures whose refractive indices span the range from 1.5 to 2.0
 $SiO_2$ and $SnO_2$
 $SiO_2$ and $Si_3N_4$
 $SiO_2$ and $TiO_2$
 $SiO_2$ and $In_2O_3$
 $SiO_2$ and $Cd_2SnO_4$

PROCESS FOR FORMING FILMS

Films can be formed by simultaneous vacuum evaporation of the appropriate materials of an appropriate mixture. For coating of large areas, such a window glass, chemical vapor deposition (CVD) at normal atmospheric pressure is more convenient and less expensive. However, the CVD method requires suitable volatile compounds for forming each material. Silicon dioxide can be deposited by CVD from gases such as silane, $SiH_4$, dimethylsilane $(CH_3)_2SiH_2$, etc. Liquids which are sufficiently volatile at room temperature are almost as convenient as gases; tetramethylin is such a source for CVD of tin compounds, while $(C_2H_5)_2SiH_2$ and $SiCl_4$ are volatile liquid sources for silicon.

A continuously graded layer of mixed silicon-tin oxide may be built up during a continuous CVD coating process on a continuous ribbon of glass by the following novel procedure. A gas mixture is caused to flow in a direction parallel to the glass flow, under (or over) the ribbon of hot glass, as shown, for example, in FIG. 4. The gas mixture contains an oxidizable silicon compound, an oxidizable tin compound, and oxygen or other oxidizing gas. The compounds are chosen so that the silicon compound is somewhat more quickly oxidized than is the tin compound, so that the oxide deposited on the glass where the gas mixture first strikes the hot glass surface, is mainly composed of silicon dioxide, with only a small percentage of tin dioxide. The proportions of silicon and tin compounds in the vapor phase are adjusted so that this intially deposited material has a refractive index wich closely matches that of the glass itself. Then, as the gas continues in contact with the glass surface, the proportion of tin oxide in the deposited film increases, until at the exhaust end of the deposition region, the silicon compound has been nearly completely depleted in the gas mixture, and the deposit formed there is nearly pure tin oxide. Since the glass is also continually advancing from the relatively silicon-rich (initial) deposition region to a relatively tin-rich (final) region, the glass receives a coating with a graded refractive index varying continuously through the coating thickness, starting at the glass surface with a value matching that of glass, and ending at its outer surface, with a value matching that of tin oxide. Subsequent deposition regions, indicated in FIG. 3, can then be used to build up further layers of pure tin oxide, or layers of tin oxide doped, for example, with fluorine.

A suitable gas mixture for this purpose, preferably includes the oxidizable silicon compounds, 1,1,2,2, tetramethyldisilane ($HMe_2SiSiMe_2H$); 1,1,2, trimethyldisilane $H_2MeSiSiMe_2H$, and/or 1,2, dimethyldislane

($H_2MeSiSiMeH_2$) along with tetramethyltin ($Me_4Sn$). It has been found that the initially deposited film is silicon-rich, and has a refractive index close to that of glass, while the later part of the deposit is almost pure tin oxide.

The Si—H bonds in the above-disclosed silicon compounds are highly useful in the process, since compounds without Si—H bonds, such as tetramethylsilane $Me_4Si$, or hexamethyldisilane $Me_3SiSiMe_3$, are oxidized more slowly than is tetramethyltin, and the initial deposit is mainly tin oxide, and the latter part of the deposit is mainly silicon dioxide. In such a case, i.e. when one is using compounds such as $Me_4Si$, one may flow the gas and glass in opposite directions in order to achieve the desired gradation of refractive index, provided the gas flow is faster than the glass flow. However, the preferred embodiment is to use the more easily oxidizable silicon compounds, and concurrent gas and glass flow directions.

It is also desirable, in forming coatings wherein the composition varies monotonically with distance from the substrate, that the silicon compounds have a Si—Si bond as well as the Si—H bond. For example, a compound containing Si—H but not SiSi bonds, dimethylsilane $Me_2SiH_2$, along with tetramethyltin, produces an initial deposit of nearly pure tin oxide, which then becomes silicon-rich at an intermediate time and finally becomes tin-rich still later in the deposition. Although Applicant does not wish to be bound by the theory, it is believed that the Si—Si—H arrangement facilitates rapid oxidation by an initial thermally induced decomposition in which the hydrogen migrates to the neighboring silicon $HMe_2Si—SiMe_2H \rightarrow Me_2SiH_2 + Me_2Si$. The reactive dimethylsilylene $Me_2Si$ species is then rapidly oxidized, releasing free radicals such as hydroxyl (OH), which then rapidly abstract hydrogen from the Si—H bonds, thus creating more reactive silylene radicals, forming a chain reaction. The tetramethyltin is less reactive to these radicals, and thus mainly enters into the later stages of the oxidation. The $Me_2SiH_2$ lacks the rapid initial decomposition step, and thus, cannot begin oxidation until after some tetramethyltin has decomposed to form radicals ($CH_3$, OH, O, etc.) which then preferentially attack the $Me_2SiH_2$, at intermediate times, until the $Me_2SiH_2$ is consumed, after which stage the oxidation of tetramethyltin becomes dominant again.

It is preferred to have at least two methyl groups in the disilane compound, since the disilanes with one or no methyl substituents are spontaneously flammable in air, and thus must be pre-mixed with an inert gas such as nitrogen.

Other hydrocarbon radicals, such as ethyl, propyl, etc., may replace methyl in the above compounds, but the methyl ones are more volatile and are preferred.

Higher partially alkylated polysilanes, such as polyalkyl-substituted trisilanes or tetrasilanes, function in a way similar to the disilanes. However, the higher polysilanes are harder to synthesize, and less volatile than the disilanes, which are therefore preferred.

When the initial deposition of the silica-tin oxide films contain less than about 40% of tin oxide, there will be little or no haze created at the interface of the glass substrate and the coating thereover. If it, for some reason, is desired to start the gradient above about 30% of tin oxide, it is preferable to have the glass coated with a haze-inhibiting layer, i.e. silicon dioxide. Such a haze-inhibiting layer may be very thin, e.g. in the nature of 25 to 100 angstroms.

IN THE DRAWINGS

Figure 4:
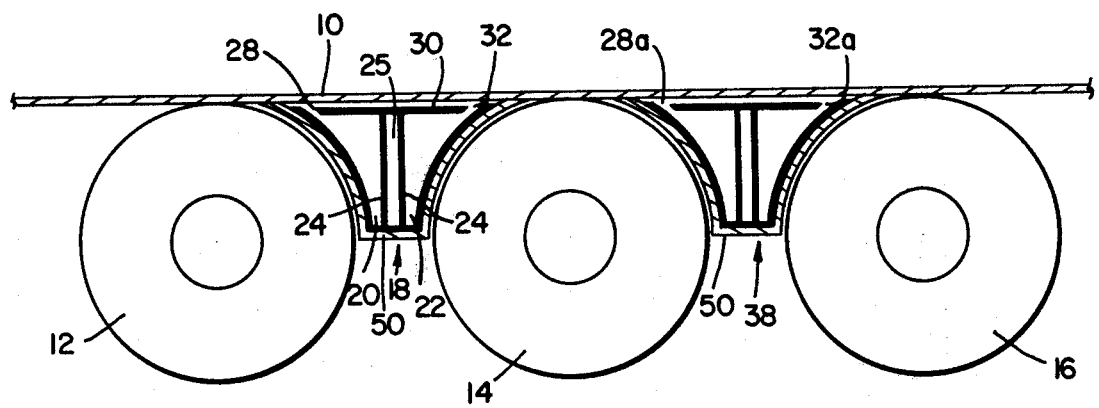
FIG. 4 is a section, somewhat simplified to facilitate the description thereof, of, of a novel apparatus of the type convenient for use in the process of the invention.

FIG. 4 illustrates a section of a lehr in a float glass line. The structure of the lehr itself is not shown for purposes of clarity. The hot glass 10, e.g. about 500°–600° C., is carried on rollers 12, 14, and 16 through the lehr. Between rollers 12 and 14 is positioned gas duct assembly 18 which comprises a gas inlet duct 20 and a gas outlet duct 22. Between ducts 22 and 20 and separated therefrom by heat exchanging wall members 24 is a duct 25 forming means to carry a heat exchange fluid, which, in turn forms means to cool gas exhaust from duct 22 and to heat gas flowing through duct 20. The temperature of the heat exchange fluid is maintained at a sufficiently low temperature so that coating does not take place on the surface of the inlet duct.

Gas entering inlet 20 travels through a slit-like opening 28, thence along a reaction zone formed by the top surface 30 of duct assembly 18 and the lower surface of glass sheet 10. Upon reaching a second slit-like opening 32, the remaining gas is exhausted through duct 22. It is during the passage of the gas along the lower surface of glass sheet 10 that a gradient coating is formed by the selective depletion of one of the reactants at different points along the length of the deposition zone between rollers 12 and 14.

In the apparatus of FIG. 4 a second gas duct assembly 38 is used to complete the deposition of a coating, e.g. by adding a fluoride-doped tin oxide coating to the pre-deposited gradient coating. Again, it is convenient to have gas enter the upstream port 28a and leave the downstream port 32a.

The ducting is suitably formed of corrosion resistant steel alloys and comprises a jacket 50 of thermal insulation.

ILLUSTRATIVE EXAMPLES OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

EXAMPLE 1

Glass heated to about 580° C. is moved at a rate of 10 cm/sec across the apparatus shown in FIG. 4. The temperature of the gas inlet duct is maintained at a temperature of about 300° C., by blowing appropriately heated or cooled air through the temperature control duct. The first deposition region reached by the glass is supplied with a gas mixture of the following composition (in mole percent):

| 1,1,2,2 tetramethyldisilane | 0.7% |
|---|---|
| tetramethyltin | 1.4% |
| bromotrifluoromethane | 2.0% |
| dry air | balance |

The second deposition region is supplied with a gas mixture of the following composition (in mole percent):

| tetramethyltin | 1.6% |
|---|---|
| bromotrifluoromethane | 3.0% |
| dry air | balance |

The flow rates of these gas mixtures are adjusted so that the average duration of contact between a given element of the gas mixture and the glass surface is about 0.2 seconds.

The resulting coated glass is color-neutral in appearance, in reflected daylight. It has a visible reflectivity of 15%, and no visible haze. The infrared reflectivity is 90% at a 10 micron wavelength. The electrical resistance is measured to be 5 ohms per square. The coating is about 0.5 microns thick.

EXAMPLE 2

The decomposition described in Example 1 is repeated, the only difference being the composition of the gas mixture supplied to the first deposition region:

| 1,2 dimethyldisilane | 0.4% |
|---|---|
| 1,1,2 trimethyldisilane | 0.3% |
| 1,1,2,2 tetramethyldisilane | about 0.02% |
| tetramethyltin | 1.5% |
| bromotrifluoromethane | 2.0% |
| dry air | balance |

The properties of the resulting product are indistinguishable from those of Example 1.

Figure 5:
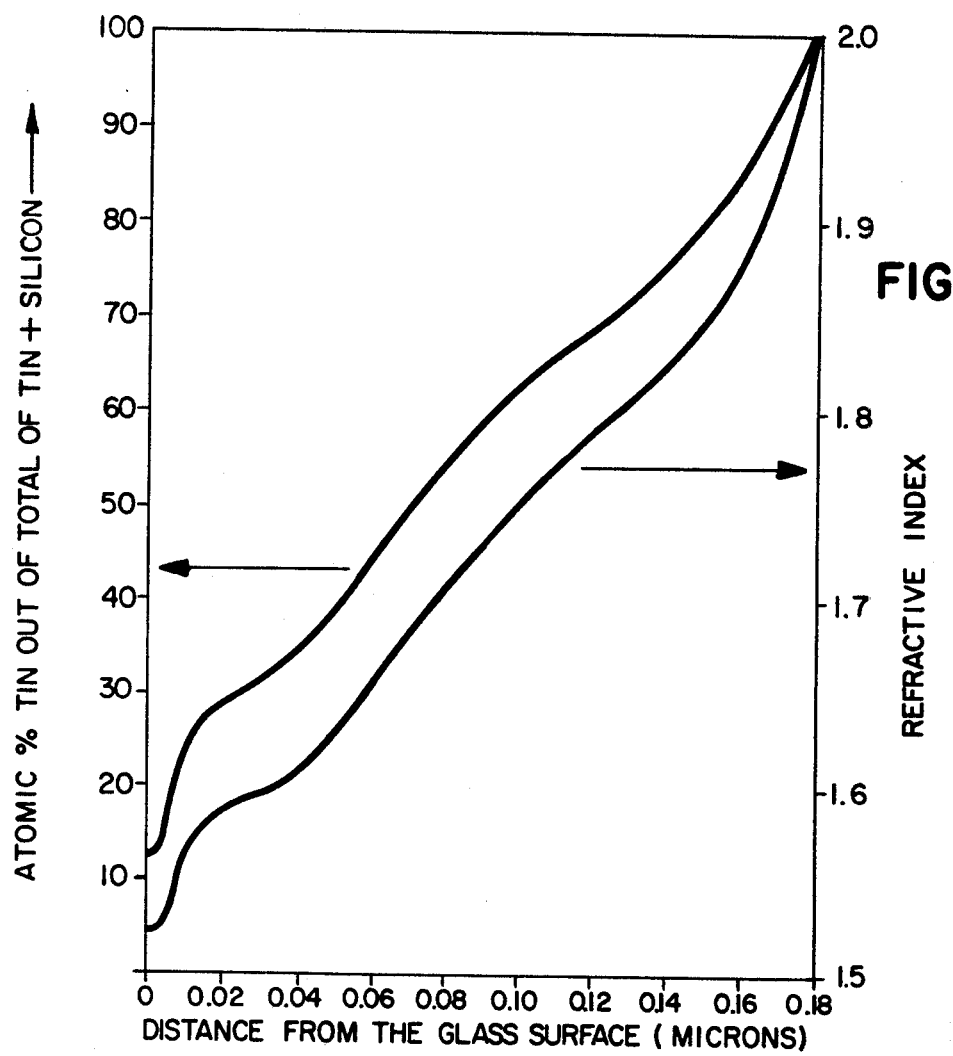
FIG. 5 illustrates the experimental measurement of the gradient in chemical composition of a silica-tin oxide gradient zone prepared according to the invention.

Samples of these coated glasses have been subject to Auger chemical analysis of the coating composition along with ion sputter-etching to reveal their chemical composition versus thickness. FIG. 5 shows the resulting chemical composition profile of the deposit over the region in which it varies. Near the glass surface the deposit is mainly silicon dioxide, with about one silicon atom out of eight being replaced by tin. As the distance away from the glass surface increases, the tin concentration increases and the silicon concentration decreases, so that by distances greater than 0.18 micron from the glass surface, the deposit becomes tin oxide, with about 1.5 percent of the oxygen replaced by the fluorine.

Figure 1:
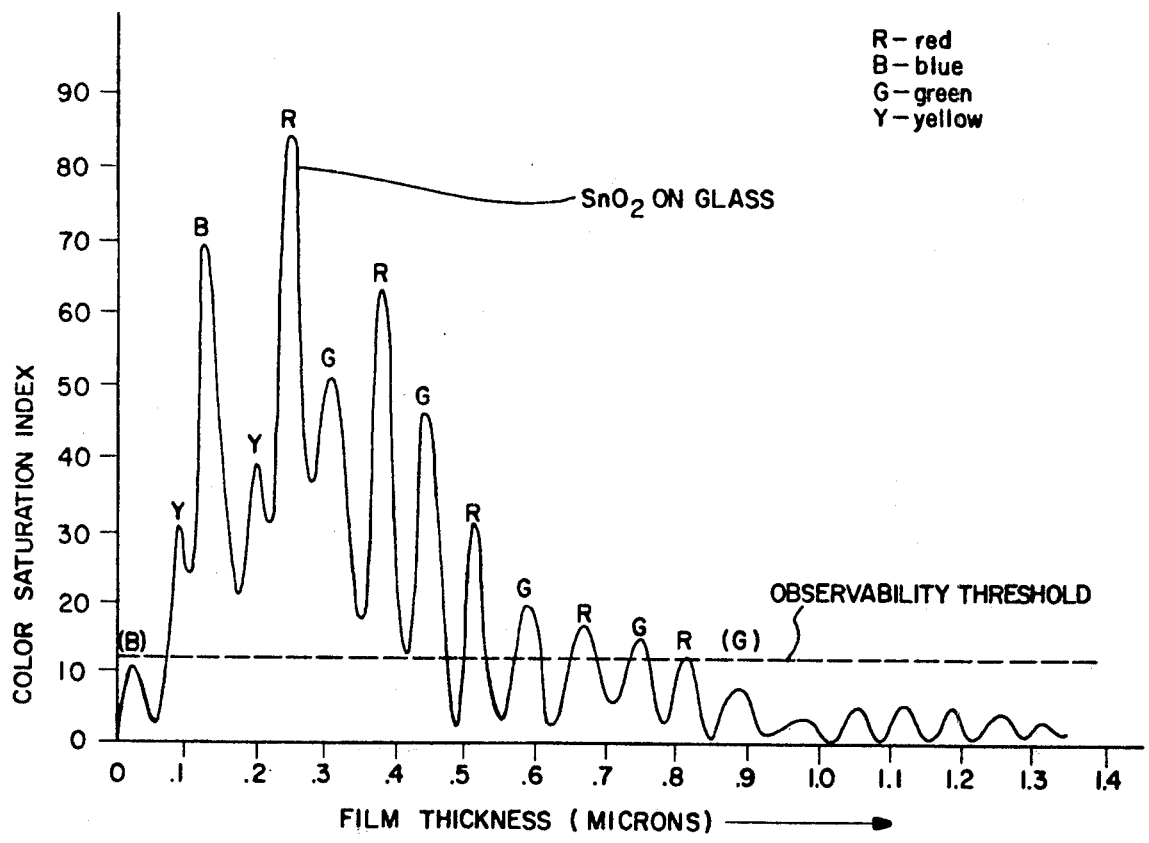
FIG. 1 is a graph illustrating the variation of calculated color intensity of various colors with semiconductor film thickness.
Figure 2:
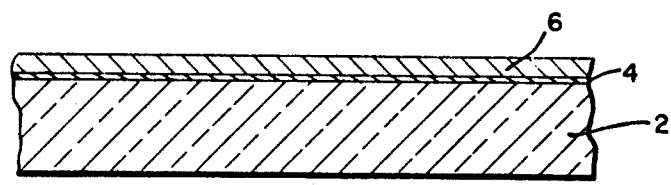
FIG. 2 illustrates, schematically and in section, a non-iridescent coated glass constructed according to the invention, with an anti-iridescent interlayer of continuously-varying composition according to the invention.
Figure 3:
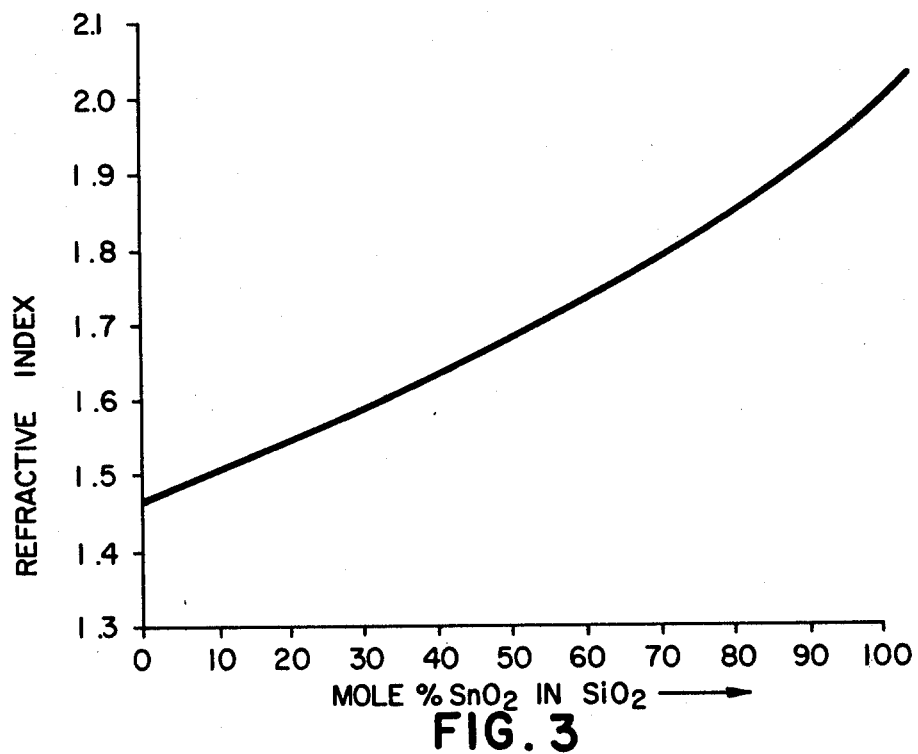
FIG. 3 is a graph indicative of a typical gradient of refractive indices, idealized, and representing the gradual transition from 100% $SiO_2$ to 100% $SnO_2$.

Using FIG. 3, the silicon-tin composition profile is converted to a refractive index versus distance profile, which is also plotted in FIG. 5. These results confirm the ability of the disclosed process to produce the desired variation of refractive index through the thickness of the deposited film.

EXAMPLE 3

A tin oxide coating is placed on a glass substrate at different thicknesses (the glass substrate is first coated with an ultra-thin film of silicon dioxide to provide an amorphous, haze-inhibiting surface.)

| Thickness of Tin Oxide | Iridescence Visibility |
|---|---|
| 0.3 micron | strong |
| 0.6 micron | distinct, but weaker |
| 0.9 micron | barely detectable except in fluorescent light |
| 1.3 micron | weak, even in fluorescent light |

The latter two materials are not aesthetically objectionable for architectural use, confirming the visual color saturation scale used to evaluate the designs.

Figure 6:
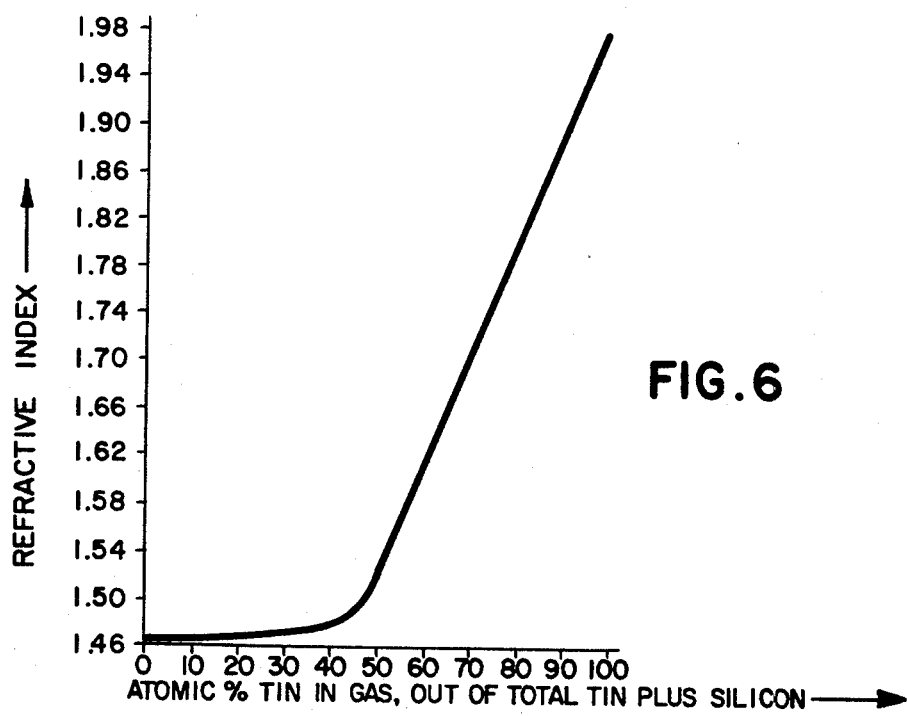
FIG. 6 shows an observed variation of the refractive index of the initial deposit of $SiO_2$—$SnO_2$ at the glass surface, as a function of gas composition.

In order to provide the most effective suppression of iridescent color, it is desirable that the refractive index of the initial deposit match closely that of the glass substrate, preferably to within ±0.04, or more preferably to within ±0.02 refractive index units. In order to achieve this match, one varies the parameters of the deposition, particularly the ratio of tin to silicon atoms in the inlet gas. As an example of such variation, FIG. 6 shows the variation of refractive index in the initial deposit from tetramethyltin plus 1,1,2,2 tetramethyldisilane gas mixtures, as a function of gas composition. The other parameters for these depositions were fixed as in Example 1. FIG. 6 shows, for example, that an initial deposit of refractive index 1.52 (appropriate to match usual window glass refractive indices) is produced by a gas composition of equal numbers of silicon and tin atoms. Matching to 1.52±0.02 is achieved when the gas composition is kept between 47 and 52 atomic percent of tin. While these exact numbers may differ somewhat in other conditions of deposition such as other temperatures or other compounds, it is a matter of routine experimentation to establish calibration curves such as FIG. 6, in order to produce a suitable match of refractive indices between the substrate and the initially deposited coating composition.

It is to be noted that the reflection of light from the surface of the coated products of Example 3 is about 16 to 17%, i.e. about 10% higher than that from the coated glass in Examples 1 and 2 which do have a graded undercoat according to the invention.

It is also to be understood that the following claims are intended to cover all of the generic and specific features of the invention herein described and all statements of the scope of the invention which might be said to fall therebetween.

What is claimed is:

1. A process for continuous coating of a substrate with a film formed of reactive components of a gas mixture in which properties of the film vary continuously through the thickness of said film, said process comprising the steps of
   (a) flowing said gas mixture through a flow path defined by a reaction zone for said reactive components, said reaction zone contiguous to and bounded by a surface of the substrate to be coated, (b) moving said substrate surface through said reaction zone in a direction parallel to said flowing gas mixture, (c) depositing, preferentially, a reaction product derived from more reactive components of said mixture on said surface of said substrate exposed earlier to said gas mixture, thereby preferentially depleting said mixture of said more reactive components, (d) depositing, preferentially, a reaction product derived from less reactive components of said mixture on said surface of said substrate exposed later to said depleted gas mixture, thus (e) providing a product in which properties of said film vary continuously in the composition through the thickness of said film, as said substrate emerges from said reaction zone.

2. A process as in claim 1 in which said substrate is composed of glass.

3. A process as in claim 1 in which said reaction products are produced by reaction of said gases induced by heat from said substrate.

4. A procss as in claim 1 in which refractive index varies continuously from bottom to top through said coating.

5. A process as in claim 4 in which said gas mixture includes volatile silicon and tin compounds and an oxidizing gas.

6. A process as in claim 5 in which said gas mixture includes at least one partially alkylated polysilane, an organotin vapor, and an oxidizing gas.

7. A process as in claim 6 in which said gas mixture contains at least one methyldisilane and also tetramethyltin.

8. A process as in claim 7 in which said gas mixture contains 1,1,2,2 tetramethyldisilane; 1,1,2 trimethyldisilane; 1,2 dimethyldisilane or mixtures thereof.

9. A process as in claim 2 in which refractive index varies continuously from bottom to top through said coating.

10. A process as in claim 2 in which said gas mixture includes volatile silicon and tin compounds and an oxidizing gas.

11. A process as in claim 2 in which said gas mixture includes at least one partially alkylated polysilane, an organotin vapor, and an oxidizing gas.

12. A process as in claim 2 in which said gas mixture contains at least one methyldisilane and tetramethyltin.

13. A process as in claim 2 in which said gas mixture contains 1,1,2,2 tetramethyldisilane, $HMe_2SiSiMe_2H$; 1,1,2 trimethyldisilane $H_2MeSiSiMe_2H$; 1,2 dimethyldisilane $H_2MeSiSiMeH_2$ or mixtures thereof.

14. A process as in claim 2 in which said reaction products are produced by reaction of said gases induced by heat from said substrate.

15. A process as in claim 3 in which refractive index varies continuously from bottom to top through said coating.

16. A process as defined in claim 10 wherein the proportions of said reactive components are so selected to achieve a coating composition proximate to said substrate of at least 60% $SiO_2$ and a coating composition most remote from said substrate of at least 95% tin oxide.

17. A process for forming, on a substrate, a thin coating which has a progressively changing composition from a predominantly first coating composition nearer the substrate to a predominantly second coating composition more remote from the substrate, said process comprising the steps of (1) introducing into a first end of a reactant chamber and out the other end of said chamber a mixture of (a) a first reactant gas from which said first coating is formed, (b) a second reactant gas from which said second coating compound is formed, and (c) a third gas which forms means to react with each of said first and second reactant gases to form said coating compounds, wherein said first reactant gas reacts at a substantially different rate with said third gas, than does said second reactant gas, the different rates of reaction with said third gas forming means to provide a difference in relative concentration of said reactant gases over the substrate as the thin coating is formed and to provide a changing ratio of said first and second coating compounds in said thin coating as said thin coating is formed on said substrate, (2) said introduction of gases being carried out while continuously passing a substrate to be coated through said reaction chamber from said first end of the chamber to said other end of the chamber.

18. A process as defined in claim 1, 2, 3, 12, 13, 16 or 17 wherein said reaction products are deposited at such a rate that said change in the coating composition is monotonic resulting in a gradual increase of the refractive index of said coating as the thickness of said coating on said substrate increases.

19. A process as defined in claim 1, 2, 3, 4, 5, 6, 7, 8, 9, 10, 12, 13, 14, 16, or 17 comprising the step of terminating said coating operation with an infra-red reflective overlay of tin oxide and wherein the total coating thickness is from about 0.1 to 1.0 micron thick.

20. A process as defined in claim 1, 2, 3, 4, 5, 6, 7, 8, 9, 10, 12, 13, 14, 16, or 17 wherein said coating is of such a thickness that it forms means to suppress visible iridescence, on the surface of a product of said process, as defined by a maximum Color Index value of about 12.

* * * * *

UNITED STATES PATENT AND TRADEMARK OFFICE
CERTIFICATE OF CORRECTION

PATENT NO. : 4,206,252
DATED : June 3, 1980
INVENTOR(S) : Roy G. Gordon

It is certified that error appears in the above-identified patent and that said Letters Patent are hereby corrected as shown below:

Column 6, line 20    "such a" should be --such as--

Column 6, line 28    "tetramethylin" should be --tetramethytin--

Column 7, line 1     "tetramethylin" should be --tetramethytin--

Column 7, line 11    "tetramethylin" should be --tetramethytin--

Column 7, line 26    "tetramethylin" should be --tetramethytin--

Column 9, line 42    "deposition" should be --decomposition--

Signed and Sealed this

Second Day of December 1980

[SEAL]

Attest:

SIDNEY A. DIAMOND

*Attesting Officer*    *Commissioner of Patents and Trademarks*